US006707528B1

(12) United States Patent
Aoyama et al.

(10) Patent No.: US 6,707,528 B1
(45) Date of Patent: Mar. 16, 2004

(54) EXPOSURE APPARATUS HAVING INDEPENDENT CHAMBERS AND METHODS OF MAKING THE SAME

(75) Inventors: Masaaki Aoyama, Chigasaki (JP); Hiroyasu Fujita, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/348,234

(22) Filed: Jul. 6, 1999

Related U.S. Application Data (63) Continuation of application No. 08/955,427, filed on Oct. 22, 1997, now abandoned, which is a continuation of application No. 08/395,315, filed on Feb. 28, 1995, now abandoned.

(30) Foreign Application Priority Data

Mar. 2, 1994 (JP) .............................................. 6-32223

(51) Int. Cl.⁷ ...................... G03B 27/00; G03B 27/42; B65G 49/07
(52) U.S. Cl. ........................ 355/18; 355/53; 414/937
(58) Field of Search .................... 355/18, 53; 414/936, 414/937

(56) References Cited

U.S. PATENT DOCUMENTS

| 4,388,034 | A | * | 6/1983 | Takahashi ............... 414/937 X |
| 4,814,625 | A | * | 3/1989 | Yabu ........................ 355/53 X |
| 4,819,167 | A | | 4/1989 | Cheng et al. .......... 364/167.01 |
| 4,856,904 | A | | 8/1989 | Akagawa ..................... 356/400 |
| 4,900,939 | A | | 2/1990 | Aoyama ...................... 250/548 |
| 4,989,031 | A | | 1/1991 | Kamiya ....................... 355/30 |
| 5,168,304 | A | * | 12/1992 | Hattori ..................... 355/53 X |
| 5,275,521 | A | * | 1/1994 | Wada ..................... 414/937 X |
| 5,308,222 | A | * | 5/1994 | Bacchi et al. ........... 414/936 X |
| 5,324,012 | A | | 6/1994 | Aoyama et al. ............... 269/21 |
| 5,339,128 | A | * | 8/1994 | Tateyama et al. ........... 354/317 |
| 5,364,222 | A | * | 11/1994 | Akimoto et al. ........ 414/937 X |
| 5,374,147 | A | * | 12/1994 | Hiroki et al. ........... 414/936 X |
| 5,498,118 | A | * | 3/1996 | Nakahara ................ 414/936 X |

FOREIGN PATENT DOCUMENTS

| JP | 63-241927 | * | 10/1988 |
| JP | 2-309624 | | 12/1990 |
| JP | 4-22118 | | 1/1992 |
| JP | 5-129181 | | 5/1993 |
| JP | 6-84868 | * | 3/1994 |

* cited by examiner

Primary Examiner—Fred L. Braun
(74) Attorney, Agent, or Firm—Miles & Stockbridge P.C.

(57) ABSTRACT

An exposure apparatus is made so as to have respective chambers in which a main exposure system, a substrate carrying system, and a mask carrying system are housed. The apparatus is structured so that the respective environments in the chambers are substantially independently maintained from each other. Substrate processing can be facilitated by incorporating photoelectric detection of the substrate center in association with handing-over of the substrate from one substrate carrying member to another, and/or storage of a cleaning substrate in a storage member which also holds substrates being processed by the apparatus.

35 Claims, 10 Drawing Sheets

EXPOSURE APPARATUS HAVING INDEPENDENT CHAMBERS AND METHODS OF MAKING THE SAME

CROSS-REFERENCE TO RELATED APPLICATIONS

This application is a continuation of application Ser. No. 08/955,427 filed Oct. 22, 1997, which is a continuation of application Ser. No. 08/395,315 filed Feb. 28, 1995 (abandoned).

BACKGROUND OF THE INVENTION

1. Field of the Invention

The present invention relates to exposure apparatus used, for example, in fabrication process of semiconductor devices.

2. Related Background Art

The exposure apparatus used in the photolithography step for fabricating semiconductor devices is provided with a wafer loader system for performing loading and unloading of wafers. Further, the exposure apparatus is also provided with a reticle loader system for selecting a desired reticle out of a lot of reticles and setting it at an exposure position.

Figure 11:
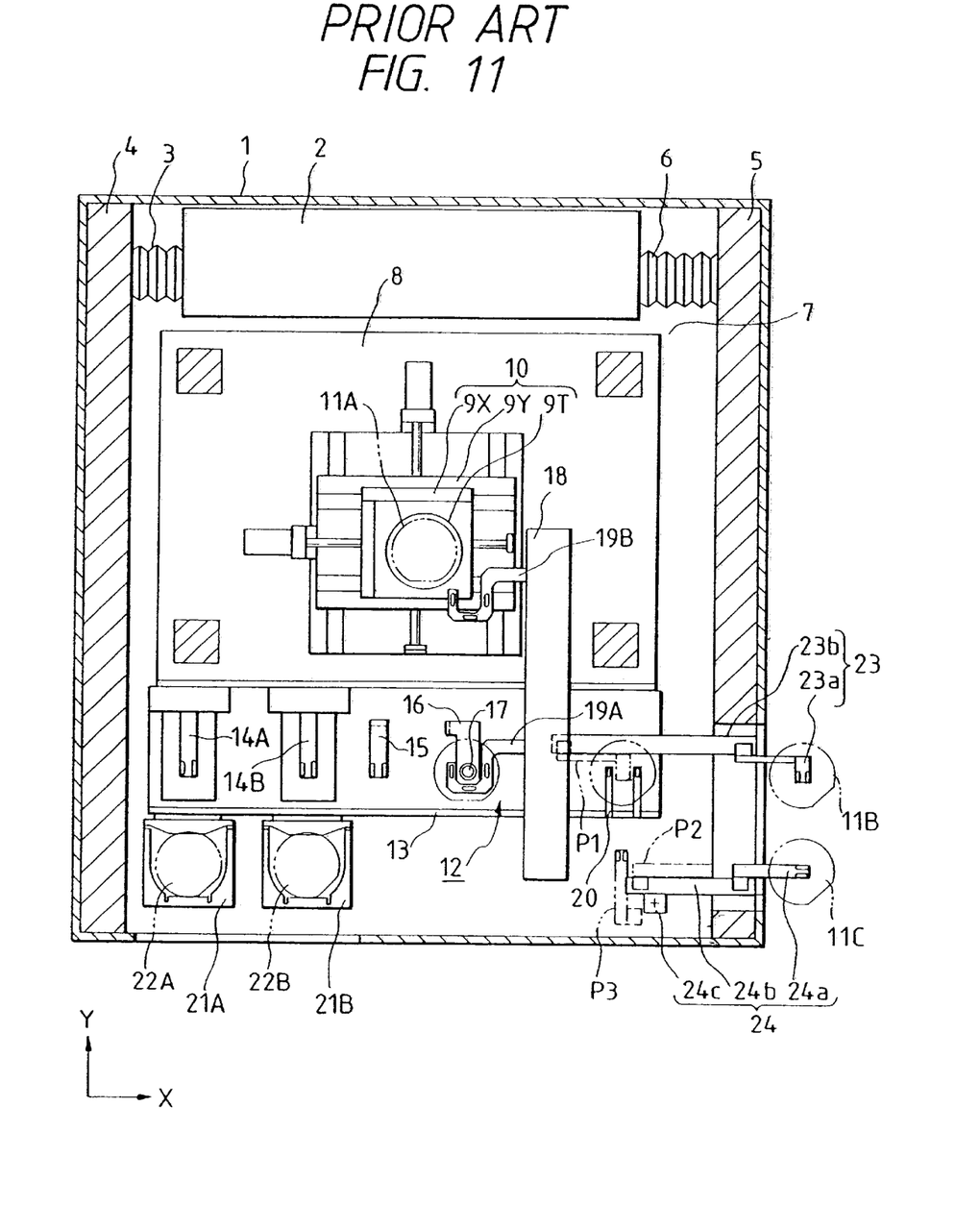
FIG. 11 is a plan view to showing an exposure apparatus provided with a conventional wafer loader system.

FIG. 11 is a plan view to show an exposure apparatus provided with a conventional wafer loader system. In this FIG. 11, an air-conditioning device 2 is set in a chamber 1 substantially isolated from the external atmosphere. Clean air blows from the air-conditioning device 2 through a vent pipe 3 and a HEPA filter (High Efficiency Particulate Air filter) 4 into the chamber 1 in the form of side flow, and the air having circulated in the chamber 1 then returns to the air-conditioning device 2 through a return (exhaust port) 5 and a vent pipe 6.

A vibration-proof table 8 is set on a floor 7 of the chamber 1. A wafer stage 10 for a wafer 11A of exposure object to be mounted thereon is set on this vibration-proof table 8. The wafer stage 10 consists mainly of a Y stage 9Y moving in the Y direction, an X stage 9X moving in the X direction, and a wafer holder 9T for holding the wafer. The wafer loader system 12 is placed beside the wafer stage 10 and on the vibration-proof table 8. The wafer loader system 12 sets (or loads) the wafer 11A on the wafer stage 10 in such a manner that a cut portion (orientation flat portion or notch portion) formed in a part of the circumference of wafer 11A is located in a predetermined positional relation relative to the wafer stage 10.

The wafer loader system 12 is constructed in such a basic arrangement that a vertical slider body 18 extending in the Y direction is fixed on a horizontal slider body 13 extending in the X direction. Two setting tables 21A and 21B are provided on a side portion of the horizontal slider body 13. Columns of storage shelves 22A and 22B for process wafers are mounted on the setting tables 21A and 21B, respectively. Wafers before exposure or wafers after exposure are stored in the columns of storage shelves 22A and 22B.

Mounted on the horizontal slider body 13 are a random access member (a wafer suction arm freely movable back and forth) 14A for taking a wafer out of the storage shelf column 22A, a random access member (a wafer suction arm freely movable back and forth) 14B for taking a wafer out of the storage shelf column 22B, a wafer hand-over member 15, and a positioning table 16, and a turn table 17 is provided on the positioning table 16. Further, a carry arm 20 is set on the horizontal slider body 13 so as to be movable in the X direction. Two carry arms 19A and 19B are provided on the vertical slider body 18 so as to be movable in the Y direction.

A wafer taken out by the random access member 14A or 14B is carried onto the turn table 17 by the carry arm 20.

Figure 12:
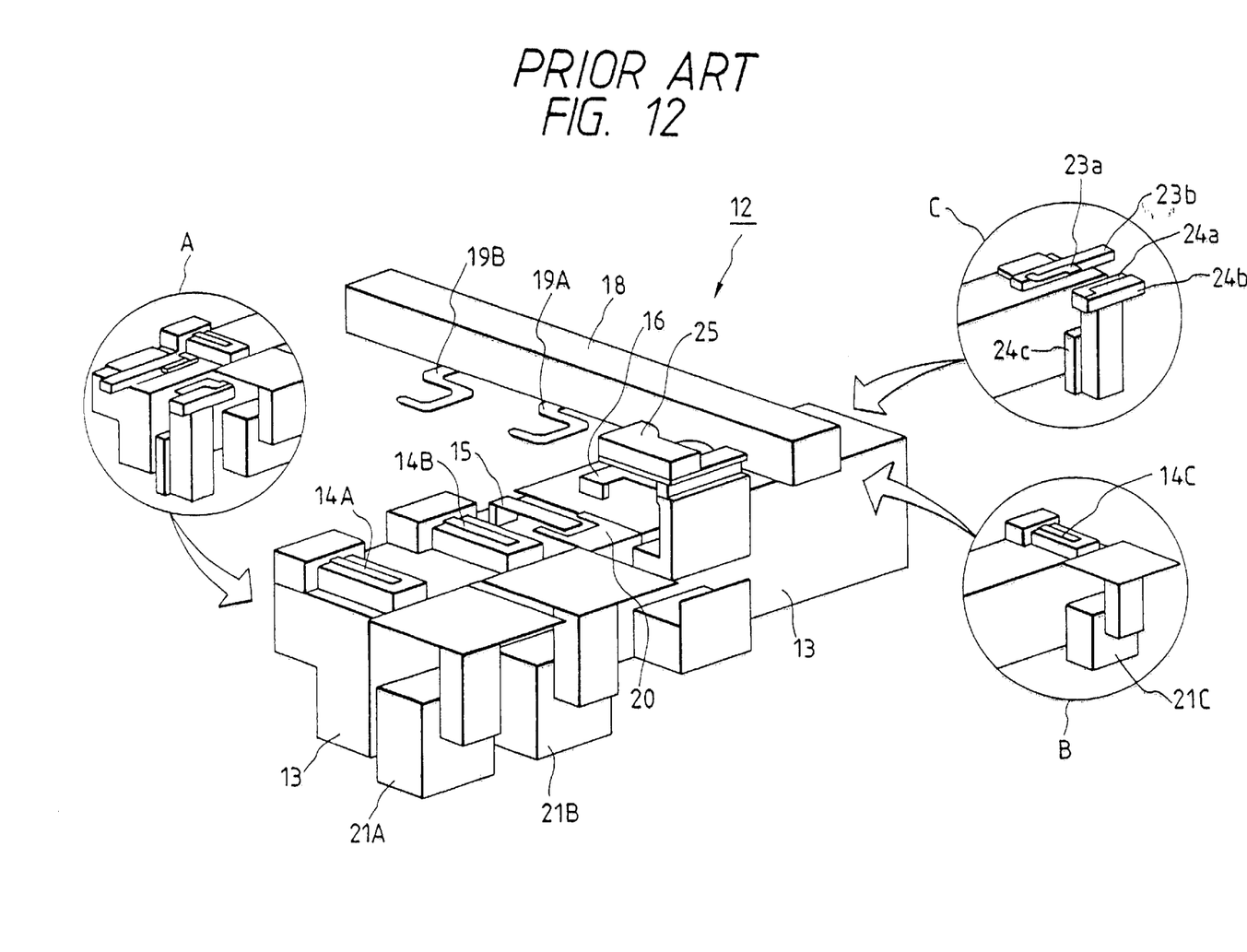
FIG. 12 is a perspective view to showing structure of the wafer loader system 12 in FIG. 11.

FIG. 12 shows the structure of the wafer loader system 12 in FIG. 11. As shown in this FIG. 12, a position correcting device 25 is placed above the positioning table 16 (including the turn table 17). Pins (not shown) are projected from the position correcting device 25 so that they come into contact with the outer periphery of a wafer rotating on the turn table 17. A center position of wafer and a position of the cut portion are detected based on the contact state of the pins, and, based on this detection result, the center of wafer and the position of the cut portion are set each at a predetermined position. After that, the wafer on the turn table is carried to the wafer stage by the carry arm 19A.

Further, in FIG. 12, the section A shows a state wherein an in-line hand-over unit for handing over a wafer to or from a coater or a developer is provided at one end of the horizontal slider body 13. The in-line hand-over unit herein means a carrying apparatus for carrying a wafer from a coater for or applying a photoresist to the wafer, etc. to the exposure apparatus, or a carrying apparatus for carrying a wafer after exposure from the exposure apparatus to a developing apparatus (developer) etc. The section B shows a state wherein a random access member 14C and a setting table 21C having a column of wafer storage shelves are added to the wafer loader system 12. The section C shows a state wherein an in-line hand-over unit is provided at the other end of the horizontal slider body 13.

Returning to FIG. 11, a first in-line hand-over unit 23 is composed of an arm 23a and a slide shaft 23b, and a second in-line hand-over unit 24 is composed of an arm 24a, a slide shaft 24b, and a rotary member 24c. After the arm 23a of the in-line hand-over unit 23 receives a wafer 11B from a coater or a developer (not shown), the wafer 11B is handed over to the carry arm 20 at position P1. Similarly, after the arm 24a of the in-line hand-over unit 24 receives a wafer 11C from a coater or a developer (not shown), the wafer 11C is handed over to the carry arm 20 via position P2 and position P3. Or, conversely, a wafer is handed over from the in-line hand-over unit 23 or 24 to the coater or developer (not shown).

In the above wafer loader system 12, the carry arm 20, carry arm 19A, carry arm 19B, arm 23a, arm 24a, random access members 14A, 14B, positioning table 16, and turn table 17 each were made of alumina ceramics, (containing 95 or more % of $Al_2O_3$), and plastic storage shelves (which can store twenty five wafers) mainly used in actual processes have been used as a substitute for the wafer storage shelves 22A and 22B.

In addition to the wafer loader system 12, a reticle loader system (not shown) was also set on the vibration-proof table 8. The reticle loader system is arranged to take a desired reticle out of a reticle case and to set it at the exposure position.

In the conventional technology as described above, because the wafer loader system 12 was set together with the wafer stage 10 on the vibration-proof table 8, vibration occurring upon carrying the wafer by the wafer loader system 12 was transferred to the wafer stage 10, which could degrade the positioning accuracy of wafer stage 10.

Since the wafer loader system or the reticle carrying system and the wafer stage 10 are set in the same chamber 1 actuation of the carrying mechanism can allow allowed dust to be mixed about the wafer stage 10 and can change the ambient temperature thereof.

Further, because the air conditioning of the whole inside of the chamber 1 was effected by one air-conditioning device 2 and a set of HEPA filter 4 and return 5, there were cases that necessary air-conditioning performance was not achieved at each of the exposure portion of the horizontal slider body 13 of the wafer loader system 12, and the reticle loader system, etc., or that the air conditioning exceeded specifications.

With respect to this, for example, if the wafer loader system 12 was located on the windward side of the exposure system, there were cases that particles caused by the wafer loader system 12, or a temperature change in this system negatively affected the exposure system on the leeward side.

Further, as shown in FIG. 11, when a wafer was handed over to or from the coater or developer, it was necessary to install the in-line hand-over units 23 and 24 etc. for exclusive use, which complicated the whole structure and which caused dust production because of an increase in the number of wafer hand-overs.

Also, high-accuracy positioning was difficult, because, in loading a wafer on the wafer stage 10, the wafer positioning was carried out by a method of bringing the pins actually in contact with the wafer on the turn table 17. Thus, the conventional technology required wafer re-positioning after setting the wafer on the wafer stage 10, correcting the wafer position while moving the X stage 9X or the Y stage 9Y, or by floating the wafer over the wafer stage 10 by air flow and then pushing the wafer against a positioning member, which complicated the control and caused the problem of dust production due to the air flow, etc.

Additionally, because the carry arm 20 and other components were made of alumina ceramics (containing 95 or more % of $Al_2O_3$) or a resin, there was a problem of adhesion of dust due to charge on the wafer or carry arm, etc. Similarly, because the wafer storage shelves 22A, 22B were also made of a resin for process, there were problems of adhesion of dust due to the charge as described above, access errors of wafer due to deformation of a shelf, etc.

Still further, there was another problem that when the resist dropped from the edge portion or the back surface of a wafer inside the storage shelves 22A, 22B, fine particles were adhered to wafers on lower shelves. Since an operator took out or brought in a cleaning substrate having the form of a thin disk in order to clean a wafer carrying surface and a contact surface of wafer holder 9T with the wafer, a long time period was necessary for cleaning, which lowered the apparatus operating efficiency and which caused a temperature change in the chamber or mixture of fine particles.

SUMMARY OF THE INVENTION

In view of the above-described points, an object of the present invention is to provide exposure apparatus with high reliability and high efficiency.

To achieve the above object, an exposure apparatus of the present invention may comprise a main exposure system for transferring a pattern on a mask set at a predetermined position, onto a photosensitive substrate, a substrate carrying system for loading the photosensitive substrate into the main exposure system and unloading the photosensitive substrate from the main exposure system, and a mask carrying system for loading the mask at said predetermined position and unloading the mask from said predetermined position, wherein the three systems are set in respective chambers independent of each other.

This arrangement can reduce vibration generated by the substrate carrying system or the mask carrying system, or the influence of dust etc. on the main exposure system.

To achieve the above object, an exposure apparatus of the present invention is preferably so arranged that a substrate holding hand rotatable about a predetermined axis and telescopically movable in the radial direction from said predetermined axis is provided in the substrate carrying system for loading or unloading the photosensitive substrate in or from the main exposure system for transferring the pattern on the mask, onto the photosensitive substrate, whereby this substrate holding hand is used to unload the photosensitive substrate out of the exposure system chamber or to load the photosensitive substrate from outside the exposure system chamber.

This arrangement permits hand-over of a photosensitive substrate with respect to a coater or developer etc. without separately setting an in-line hand-over unit, which can simplify the apparatus structure and which can lower production of dust etc. because of a decrease in the number of hand-over of photosensitive substrates.

Further, to achieve the above object, an exposure apparatus of the present invention is preferably so arranged that the substrate carrying system, for loading or unloading the photosensitive substrate in or from the main exposure system for transferring the pattern on the mask onto the photosensitive substrate, comprises a first carry member for carrying the photosensitive substrate in a first direction, a second carry member for carrying the photosensitive substrate in a second direction intersecting with the first direction in order to load the photosensitive substrate in the main exposure system and to unload the photosensitive substrate from the main exposure system, and a position detector for photoelectrically detecting a position of the center of the photosensitive substrate.

According to such an arrangement, the photosensitive substrate can be handed over from the first carry member to the second carry member after the center position of the photosensitive substrate is detected without contact with the photosensitive substrate and at high speed.

To achieve the above object, an exposure apparatus of the present invention comprises a main exposure system for transferring a pattern on a mask, onto a photosensitive substrate, a substrate carrying system for loading the photosensitive substrate in the main exposure system and unloading the photosensitive substrate from the main exposure system, a first base on which the main exposure system is set, and a second base, independent of the first base, on which the substrate carrying system is set.

This arrangement makes the vibration generated upon actuation of the substrate carrying system unlikely to be transferred to the main exposure system.

Further, in order to achieve the above object, an exposure apparatus of the present invention may comprise a main exposure system for transferring a pattern on a mask, onto a photosensitive substrate, a substrate carrying system for loading the photosensitive substrate in the main exposure system and unloading the photosensitive substrate from the main exposure system, a first vacuum pump for providing to hold the photosensitive substrate in the main exposure system, and a second vacuum pump independent of the first vacuum pump, for providing to hold the photosensitive substrate in the substrate carrying system.

This arrangement can prevent pressure variations caused upon suction or separation of the photosensitive substrate in the substrate carrying system from affecting the suction holding of the photosensitive substrate in the main exposure system. Conversely, when suction or separation of the photosensitive substrate is carried out in the main exposure system, the suction holding of the photosensitive substrate in the substrate carrying system will not be affected thereby, either.

DESCRIPTION OF THE PREFERRED EMBODIMENTS

The first embodiment of the exposure apparatus according to the present invention will be described with reference to the accompanying drawings.

Figure 1:
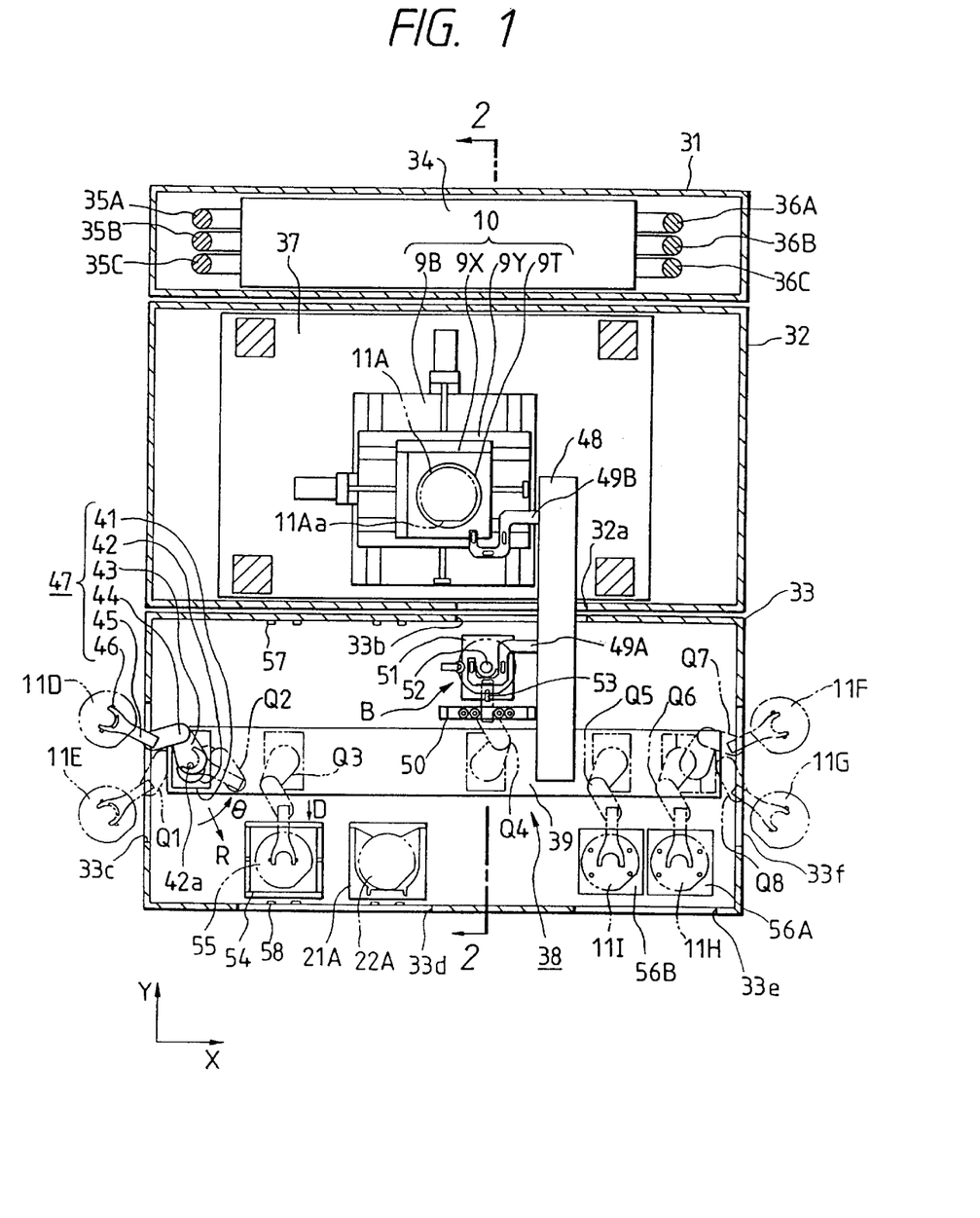
FIG. 1 is a cross-sectional plan view to showing a layout in a chamber, of a first embodiment of the exposure apparatus according to the present invention.
Figure 2:
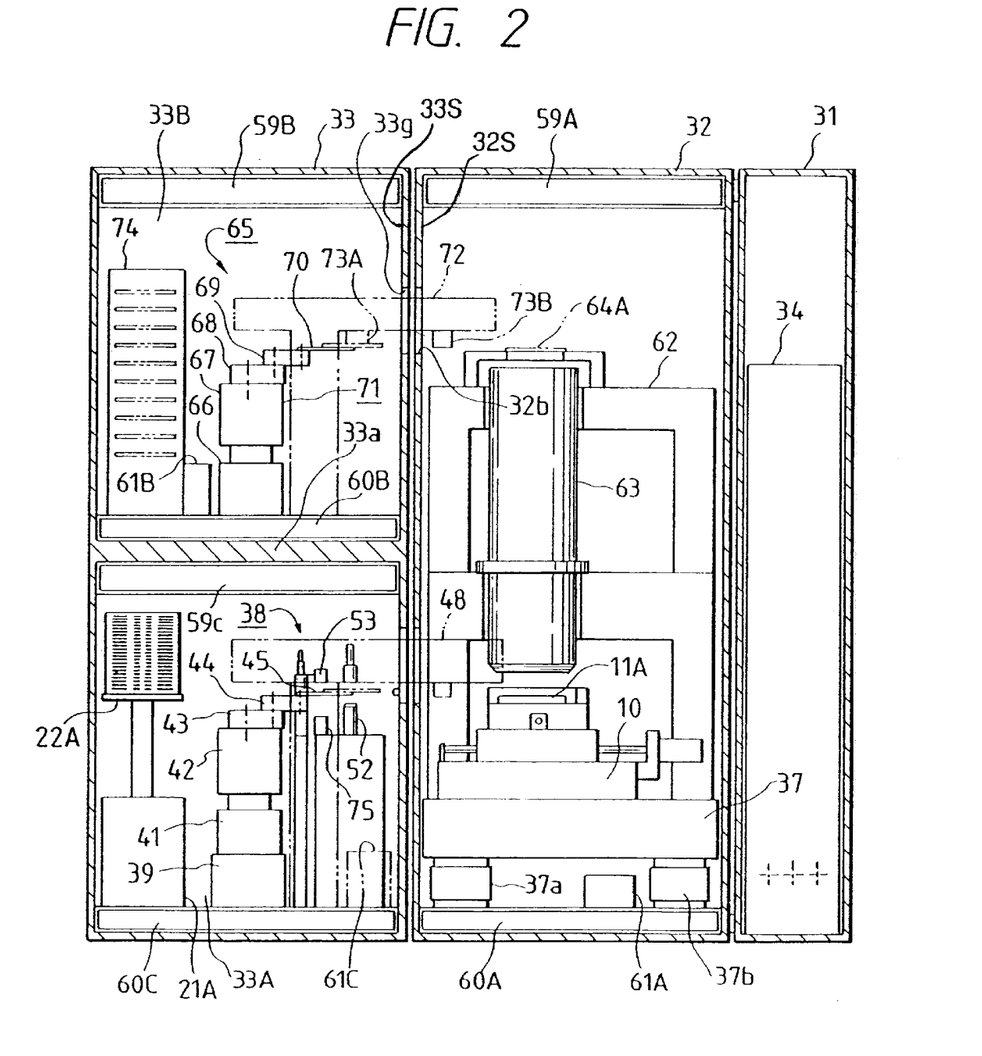
FIG. 2 is a cross section taken along line 2—2 in FIG. 1.

FIG. 1 is a cross-sectional plan view of a chamber in the exposure apparatus of the present embodiment. In FIG. 1, three independent chambers 31, 32, and 33 are juxtaposed. FIG. 2 is a cross section taken along line 2—2 in FIG. 1, and, as shown in this FIG. 2, the third independent chamber 33 is separated into a lower chamber 33A and an upper chamber 33B by a compartment plate 33a.

An air-conditioning device 34 consisting of three air-conditioning units, operating independently of each other, is set in the first independent chamber 31. Air temperature-controlled by the first air-conditioning unit in the air-conditioning device 34 blows through a first pipe 35A and a dust-removing HEPA filter 59A (FIG. 2) set on the ceiling of the second independent chamber 32 into the independent chamber 32, and then returns to the first air-conditioning unit through a return 60A set on the floor of independent chamber 32, and a first pipe 36A. Also, air temperature-controlled by the second air-conditioning unit in the air-conditioning device 34, is guided through a second pipe 35B to a HEPA filter 59C set on the ceiling of the lower chamber 33A of the third independent chamber 33. Then, the air flowing down into the lower chamber 33A to reaches a return 60C set on the floor of the lower chamber 33A and returns to the second air-conditioning unit through a second pipe 36B. Further, air temperature-controlled by the third air-conditioning unit is guided through a third pipe 35C to a HEPA filter 59B set on the ceiling of the upper chamber 33B of the independent chamber 33. Then, the air flowing down into the upper chamber 33B reaches a return 60B set on the floor and returns to the third air-conditioning unit through a third pipe 36C.

Although not shown, it is preferable that a chemical filter be provided together with the HEPA filters 59A–59C in order to prevent existing ions (for example $NH_4^+$, $SO_4^{2-}$), sulfur dioxide ($SO_2$), etc. from intruding into the independent chambers 32, 33A, 33B in which the main exposure system, the wafer loader system, etc. are set. This can prevent a phenomenon to decrease the reflectivity or transmittance of an illumination optical system due to production of ammonium sulfate $((NH_4)_2SO_4)$ etc. adhering to optical elements constituting the illumination optical system, and can also prevent occurrence of such a phenomenon that a cross section of resist pattern acquires a T shape. The chemical filter is preferably provided corresponding to each of the three HEPA filters 59A–59C. It is also conceivable that the chemical filter is provided at least for the HEPA filter 59A but not for the other HEPA filters 59B, 59C.

In FIG. 2, the main exposure system is set in the second independent chamber 32. Namely, a vibration-proof table 37 is set through vibration-proof pads 37a and 37b on the floor of independent chamber 32, and then the wafer stage 10 is placed on the vibration-proof table 37. A wafer 11A coated with a photoresist is loaded on the wafer stage 10 upon exposure. A column 62 is planted on the vibration-proof table 37. A projection optical system 63 is fixed in the middle part of column 62, and a reticle 64A as an exposure object is mounted on the reticle holder at the top end of the column 62.

Returning to FIG. 1, the wafer stage 10 is composed mainly of a base 9B, a Y stage 9Y, an X stage 9X, and a wafer holder 9T. The wafer 11A is held as an exposure object by vacuum suction on the wafer holder 9T. A cut portion, which is called an orientation flat (or notch), is formed in a part of the circular circumference of wafer 11A, and the wafer 11A is loaded on the wafer holder 9T so that this cut portion is directed in a predetermined direction and so that the center of wafer 11A is located in a predetermined positional relation relative to the wafer holder 9T.

In the present embodiment the wafer loader system 38 is provided for loading a wafer onto the wafer holder 9T and for unloading the wafer from the wafer holder 9T. The wafer loader system 38 is placed on the floor in the lower chamber 33A (FIG. 2) of the third independent chamber 33.

A guide of the wafer loader system 38 is composed of a horizontal slider body 39 extending in the X direction and a vertical slider body 48 extending in the Y direction. A scalar robot hand 47 is set on the horizontal slider body 39 so as to be slidable in the X direction. The scalar robot hand 47 consists of an X-axis moving member 41 for moving in the X direction along the horizontal slider body 39, a Z-axis moving member 42 for telescopically moving in the Z direction perpendicular to the XY plane on the X-axis moving member 41, a θ-axis rotating member 43 for rotating about the center 42a of the Z-axis moving member 42, an R-axis rotating member 44 arranged as rotatable at the distal end of the θ-axis rotating member 43, and a hand member 45 arranged as rotatable at the distal end of the R-axis rotating member 44, in which a vacuum suction portion 46 is attached to the distal end of the hand member 45. Rotating the θ-axis rotating member 43 about the center 42a, the hand member 45 rotates in the θ direction, whereby, combining rotation angles of the R-axis rotating member 44 and hand member 45 with each other, the position can be adjusted in the radial direction (in the R direction) from the center 42a of the hand member 45.

Further, setting tables 21A and 54 are provided on a side of the horizontal slider body 39, and columns of storage shelves 22A and 55 for storing wafers are set on the setting tables 21A and 54, respectively. Moreover, temporary wafer-placing tables 56A and 56B are set on the side of the horizontal slider body 39 for a wafer to be temporarily mounted thereon. A plurality of pins (four pins in FIG. 1) for wafer mounting are planted on each of the temporary placing tables 56A and 56B. Openings 33d and 33e for exchange of storage shelves etc. with the outside are provided on the side surface of the independent chamber 33 near the storage shelves 22A and 55 and near the temporary placing tables 56A and 56B, respectively for exchange of storage shelves, etc. In addition, an opening 33c is provided on the side surface of the independent chamber 33 near the left end of the horizontal slider body 38, so that by the hand portion 45 of the scalar robot hand 47 in and out through the opening 33c, a wafer 11D can be handed over to or from an external device (a coater of photoresist or a developing device, etc. set outside) and a wafer 11E can be handed over at another position Q1. Further, an opening 33f is provided on the side surface of the independent chamber 33 near the right end of the horizontal slider body 38, so that by, moving the scalar robot hand 47 to a position Q7 and projecting the hand portion through the opening 33f, a wafer 11F can be handed over to or from an external device and another wafer 11G can be handed over at another position Q8. Similarly, by moving the scalar robot hand 47 to a position Q3, Q5, or Q6, a wafer can be handed over to or from the column of storage shelves 55, temporary placing table 56A, or the temporary placing table 56B, respectively.

The vertical slider body 48 projects into the independent chamber 32 through an opening 32a on the side surface of the independent chamber 32 and an opening 33b on the side surface of the lower chamber 33A of the independent chamber 33. Two sliders 49A and 49B, each with a wafer contact portion having a C shape, are attached to the side surface of the vertical slider body 48 so as to be slidable in the longitudinal direction. These two sliders 49A and 49B each independently move between the independent chamber 32 and the lower chamber 33A while holding a wafer by vacuum suction.

The scalar robot hand 47 takes a wafer out of the storage shelves 55, for example, and thereafter hands over the wafer at position Q4 through the turn table 52 movable up and down, to the slider 49A or 49B. After that, the scalar robot hand 47 receives a wafer, after exposure, from the slider 49A or 49B similarly through an up and down motion of the turn table 52 and then returns the wafer thus received for storage such as to the storage shelves 55.

The portions which contact the wafer such as, the hand portion 45 of the scalar robot hand 47, the slider 49A, and the slider 49B, are formed of conductive ceramics having a fine surface. Alternatively, surfaces of wafer contact portions may be coated with a coating etc. of conductive ceramics with a fine surface.

When the wafer contact portions are formed of conductive ceramics, the following operational effects can be achieved: (1) production of dust is reduced because of decreased contacts with the photosensitive substrate; (2) charge on the contact portions and the photosensitive substrate is avoided so as to reduce the dust collecting effect; (3) static electricity on a charged photosensitive substrate is removed so as to prevent electrostatic discharge failure of photosensitive substrate and to reduce the dust collecting effect of the photosensitive substrate; and (4) because the contact portions are fine, the anchor effect (drawing effect) upon adhesion of particles (fine particulates) is reduced so as to facilitate cleaning.

In FIG. 1 a sensor table 50 is set near a region where the horizontal slider body 39 and the vertical slider body 48 intersect with each other, i.e., near the position Q4. A center position sensor (as described hereinafter) for detecting a position of the wafer center is placed on this sensor table 50. An adjustment table 51 is placed near the sensor table 50. A conductive ceramic turn table 52 is provided above the adjustment table 51 so as to be rotatable about an axis perpendicular to the XY plane. There are a light-projecting device 53 in a cut detection sensor for detecting a position of the linear cut portion (orientation flat) in the wafer circumference, and a line sensor 75 consisting mainly of a one-dimensional CCD (FIG. 2), as arranged on the adjustment table 51 and at a position between the turn table 52 and the sensor table 50. The light-projecting device 53 projects a slit light beam to which the photoresist on the wafer is not sensitive, toward the line sensor 75, and the line sensor 75 detects a length of a shielded portion in the slit light beam to supply the detection result to an unrepresented control system.

Figure 3:
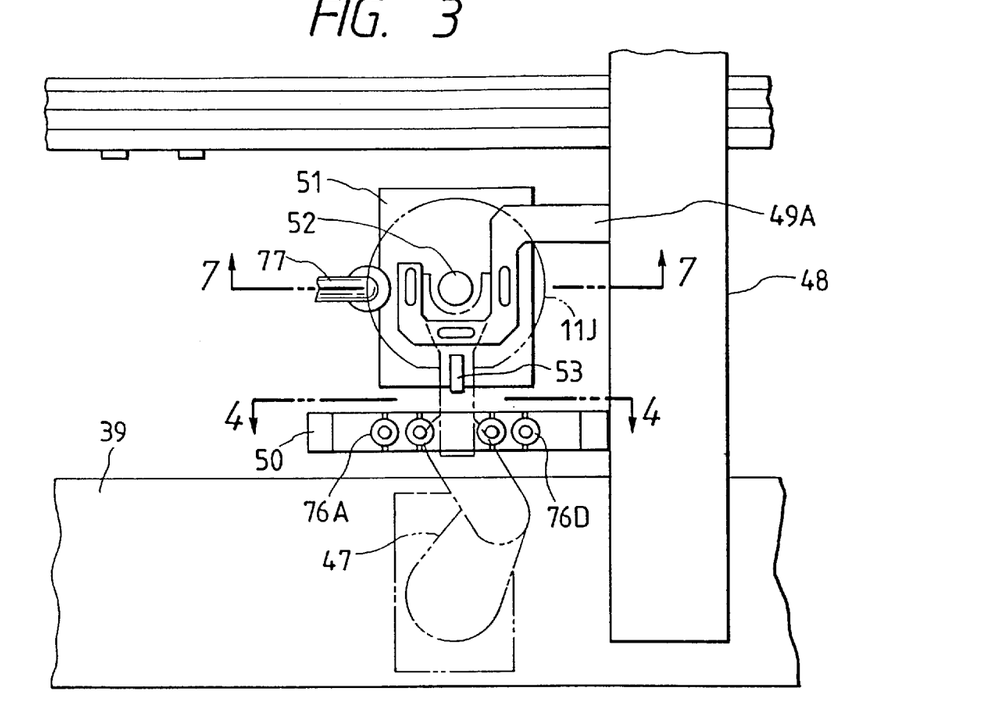
FIG. 3 is an enlarged view of section B in FIG. 1.
Figure 4:
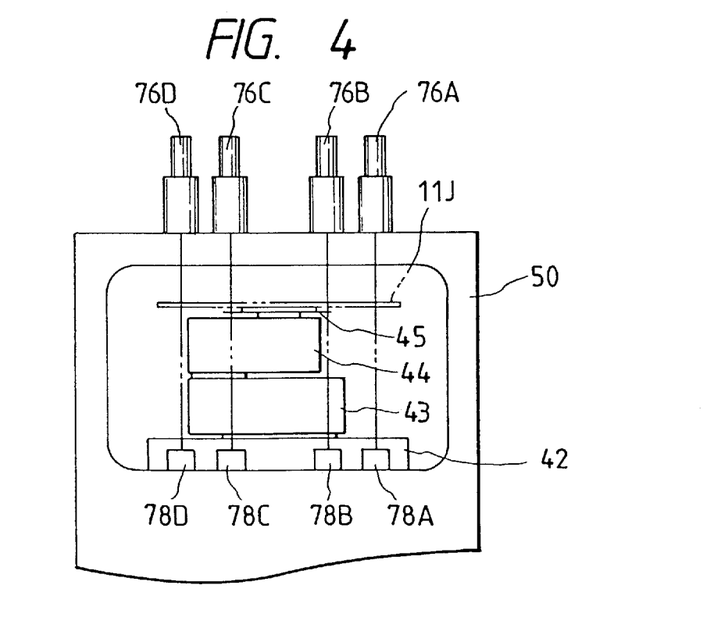
FIG. 4 is a view observed in the direction of arrows along line 4—4 in FIG. 3.

FIG. 3 is an enlarged view of the portion B near the region where the horizontal slider body 39 and vertical slider body 48 intersect with each other in FIG. 1. In FIG. 3, when the wafer 11J is handed over from the scalar robot hand 47 onto the turn table 52, the wafer 11J first passes inside the sensor table 50. As shown in FIG. 4, which is a cross section taken along 4—4 line in FIG. 3, there are four light-projecting devices 76A–76D provided in the upper portion of sensor table 50, and four light-receiving devices 78A–78D arranged as opposed to the light-projecting devices in the lower portion of sensor table 50. The wafer 11J passes between those light-projecting devices 76A–76D and light-receiving devices 78A–78D. Each light-projecting device 76A–76D emits a beam of illumination light to which the photoresist on the wafer is not sensitive.

In this case, because the wafer 11J is substantially circular as shown in FIG. 3, the position of the center of wafer 11J can be obtained by the unrepresented control system from a relation between a position of wafer 11J in the direction to the turn table 52 and a timing between the moment when the light is shielded by the wafer 11J in each of the light-receiving devices 78A–78D in FIG. 4 and the moment when the light is received. Then the scalar robot hand 47 places the wafer 11J on the turn table 52 so that the position of the center of wafer 11J coincides with the rotational center of the turn table 52. On this occasion the slider 49A is moved to below the wafer 11J. Based on the information on the center position, the wafer 11J is mounted on the turn table 52 with their centers matching with each other by controlling the R axis and the θ axis (or the X axis) of the scalar robot hand 47. The wafer 11J is vacuum-sucked on the turn table 52. According to the above positioning method, the wafer center is positioned relative to the center of turn table 52 approximately at the accuracy of about ±0.2 mm.

Rotating the turn table 52 in that state, the peripheral edge of wafer 11J rotates between the light-projecting device 53 and the line sensor 75 (FIG. 2) in the cut detection sensor. Since the length of the light-shielded portion is decreased when the cut portion (orientation flat or notch) of wafer 11j passes over the line sensor 75, whereby the unrepresented control system can detect the position of the but portion of wafer 11J. According to this detection result, the rotation of the turn table 52 is stopped at a position where the cut portion of wafer 11J is opposed for example to the horizontal slider body 39. After that, the suction of wafer 11J by the turn table 52 is released, and the turn table 52 is lowered. Then, the wafer 11J is vacuum-sucked on the surface of slider 49A, and the slider 49A is moved along the vertical slider body 48 to the independent chamber 32 in FIG. 1. Then, the wafer 11J is transferred from the slider 49A to the wafer holder 9T by an unrepresented wafer hand-over means (which may be for example movable pins provided in the wafer holder 9T, being movable up and down (in the direction perpendicular to the plane of FIG. 1) and having a surface in which a groove for vacuum suction is formed). On this occasion, the wafer 11J is mounted on the wafer holder 9T while the center of wafer 11J and the location of the cut portion each are accurately set in a predetermined state.

Further, there are generally concentric protrusions on the wafer holder 9T and the wafer 11J is mounted on these concentric protrusions. It is thus desired that the contact portions of the scalar robot hand 47 and the sliders 49A, 49B with the wafer 11J be differentiated from the contact portions on the wafer holder 9T. Namely, positions on the back wafer surface in contact with the scalar robot hand 47 and the sliders 49A, 49B are made different from positions on the back wafer surface in contact with the projections of wafer holder 9T. In this case, the positions and areas of the contact portions of the scalar robot hand 47 and the sliders 49A, 49B with wafer can be determined according to the shape of the protrusions of wafer holder 9T. By this, the flatness of wafer on the wafer holder 9T can be well maintained. The reason is as follows. Even if a foreign material is adhered to the back wafer surface because of the contact with the scalar robot hand 47 and the sliders 49A, 49B, the foreign material will never be sandwiched between the protrusions of wafer holder 9T and the wafer.

The line sensor 75 of FIG. 2 may be replaced by an analog sensor wherein a cylindrical lens is combined with a light-receiving element (for example a photodiode). With use of this analog sensor a quantity of received light of the light-receiving element changes depending upon the length of the light-shielded portion by the wafer, whereby the length of the light-shielded portion can be detected. Also, the positioning of the cut portion (orientation flat or notch) of wafer 11J may be carried out in such a manner that two pairs of light-projecting devices 53 and analog sensors are arranged at two respective locations in the circumferential direction of wafer and that the rotational position of turn table 52 is fixed by the servo method so as to balance output signals from the two analog sensors.

Returning to FIG. 3, above the adjustment table 51 there is a light guide 77 for guiding light obtained by separating part of the exposure light for illuminating the reticle.

Figure 7:
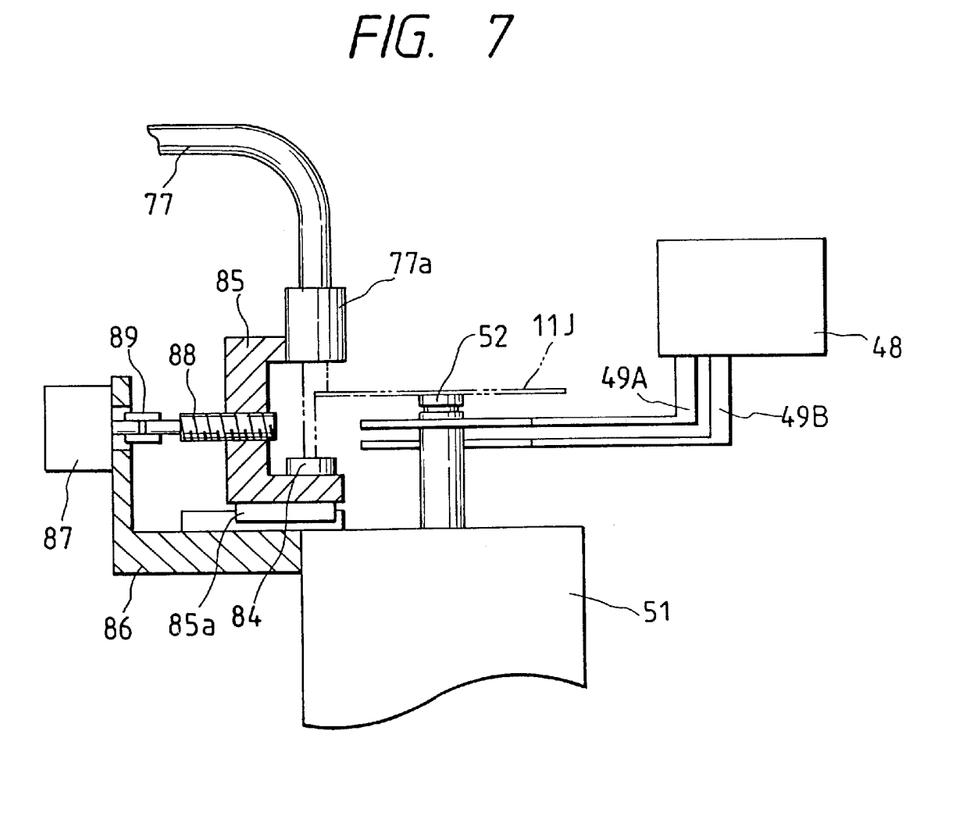
FIG. 7 is a cross section taken along line 7—7 in FIG. 3.

FIG. 7 is a cross section taken along 7—7 line in FIG. 3. As shown in this FIG. 7, an emission end 77a of the light guide 77 is attached to an upper end of a moving C-shape table 85. A line sensor 84, consisting of a one-dimensional CCD, is fixed to the lower end, of the moving table 85 so as to be opposed to the emission end 77a. A slider 85a fixed to the bottom surface of the moving table 85 is set in a guide member on a support table 86 fixed to the adjustment table 51. A drive motor 87 is fixed to the support table 86, a feed screw 88 is screwed in a side of the moving table 85 in parallel with the sliding direction of slider 85a, and the feed screw 88 is coupled through a coupling 89 with a rotational shaft of the drive motor 87. The moving table 85 moves in the radial direction with respective to the center of the turn table 52. With actuation of the drive motor 87, the moving table 85 is moved along the radial direction.

Upon so-called peripheral exposure, the slit exposure light, to which the photoresist laid on the wafer 11J is sensitive, is emitted from the emission end 77a of the light guide 77 toward the peripheral edge of wafer 11J sucked on the turn table, 52, and the line sensor 84 detects the length of the light-shielded portion of the exposure light to supply the detection result to the unrepresented control system. The peripheral exposure herein means that only the photoresist at the peripheral edge of wafer 11J is exposed to the exposure light in order to prevent dust from being produced from the peripheral edge of wafer 11J. In this case, because the present embodiment is so arranged that the rotational center of turn table 52 is substantially accurately coincident with the center of wafer 11J, the width of the peripheral exposure of wafer 11J can be accurately set to a desired value by adjusting the position of the moving table 85 and then emitting the exposure light from the emission end 77a. Since the position of the cut of wafer is known, an encoder-added motor or a stepping motor may be employed for the turn table 52 to adjust the position of the moving table 85 so as to keep the width of peripheral exposure constant when the cut portion of wafer 11J reaches between the exit end 77a and the line sensor 84, whereby the peripheral exposure can be effected in the constant width even in the cut portion of wafer 11j.

Returning to FIG. 2, the reticle loader system 65 is placed on the return 60B in the upper chamber 33B of the independent chamber 33. A guide of the reticle loader system 65 consists of a vertical slider body 72 projecting through an opening 32b of the independent chamber 32 and an opening 33g of the upper chamber 33B into the independent chamber 32, and two sliders 73A and 73B are attached to the vertical slider body 72 so as to be slidable along the vertical slider body 72. Installed near a support table of the vertical slider body 72 is a scalar robot hand consisting of a base 66, a Z-axis moving member 67 for telescopically moving in the Z direction perpendicular to the XY plane on the base 66, a θ-axis rotating member 68 for rotating about the Z-axis moving member 67, an R-axis rotating member 69 arranged as rotatable at the distal end of this θ-axis rotating member 68, and a hand member 70 arranged as rotatable at the distal end of the R-axis rotating member 69.

As will be appreciated especially from FIG. 2, the adjacent sidewalls 32S and 33S of chambers 32 and 33 constitute respective compartment members which spatially separate the main exposure system from the wafer loader system 38 and the reticle loader system 65.

A column of storage shelves 74 for reticles is set near the scalar robot hand for reticles. The hand member 70 of the scalar robot hand takes a reticle by vacuum suction from the storage shelves 74 and hands over the thus taken reticle to the slider 73A or 73B of the vertical slider body. After that, while holding the reticle by vacuum suction, the slider 73A or 73B moves along the vertical slider body 72 into the independent chamber 32 and then sets the reticle on the reticle holder on the column 62 of the main exposure system through an unrepresented reticle hand-over means. When a reticle is exchanged for another, the reticle taken out of the reticle holder is returned through the slider 73A or 73B and the scalar robot hand for reticles to the storage shelves 74. Since the scalar robot hand is also used for carrying the reticle as described, the reticle loader system 65 is simplified.

Further, in FIG. 2, vacuum pumps 61A, 61C, and 61B are set in the second independent chamber 32, the lower chamber 33A of the third independent chamber 33, and the upper chamber 33B, respectively, so that the vacuum pump 61A supplies a negative pressure for vacuum suction in the main exposure system in the independent chamber 32, the vacuum pump 61C supplies a negative pressure for vacuum suction in the wafer loader system 38 in the chamber 33A, and the vacuum pump 61B supplies a negative pressure for vacuum suction in the reticle loader system 65 in the chamber 33B.

As described, the present embodiment is arranged to perform the vacuum suction in the main exposure system, the vacuum suction in the wafer loader system 38, and the vacuum suction in the reticle loader system 65 independently of each other, thus presenting an advantage that there is no influence of suction or separation of wafer transferred between the systems. While a reticle pattern is projected onto a wafer sucked on the wafer holder 9T of the main exposure system in the independent chamber 32, there is no pressure change on the side of wafer holder 9T even with start or stop of vacuum suction in the wafer loader system 38 or the reticle loader system 65, thus presenting an advantage that no wafer positional deviation occurs.

Figure 5:
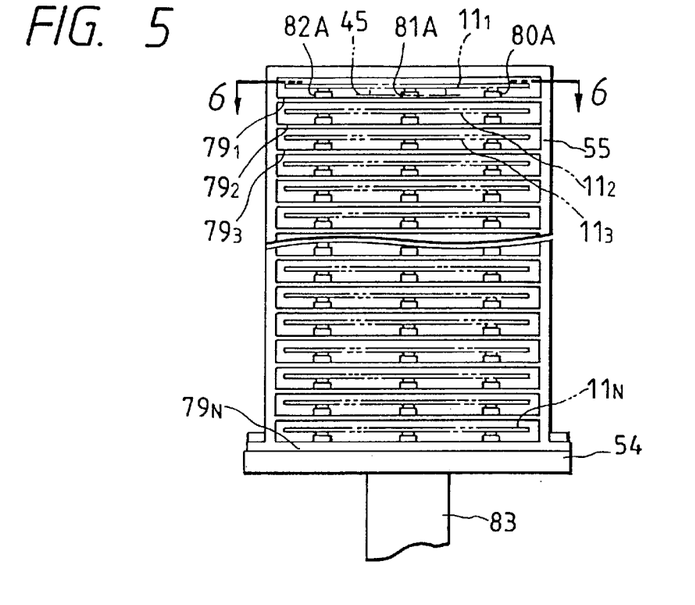
FIG. 5 is an enlarged view observed in the direction D of FIG. 1.
Figure 6:
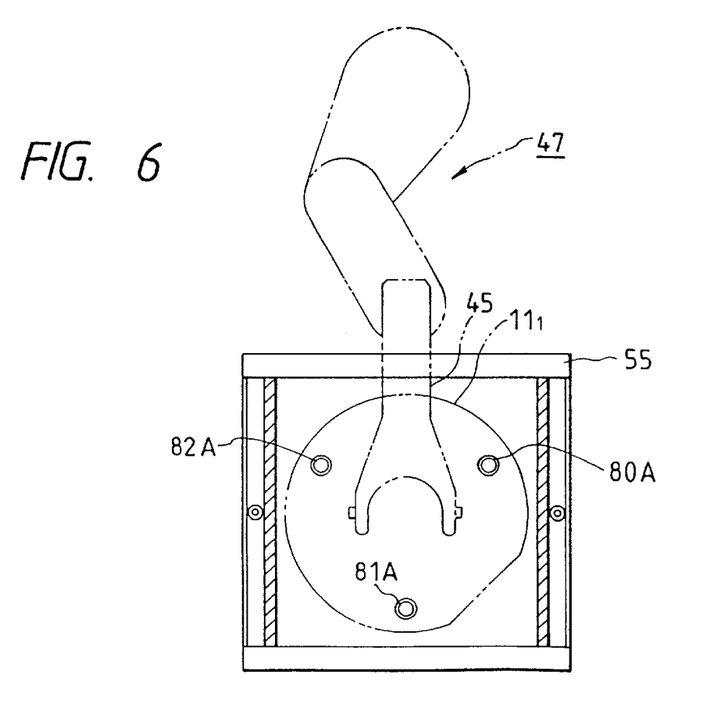
FIG. 6 is a cross section taken along line 6—6 in FIG. 5.

The structure of the column of storage shelves 55 in FIG. 1 is next described in detail referring to FIG. 5 and FIG. 6. FIG. 5 is a view observed in the direction of arrow D in FIG. 1. As shown in FIG. 5, the column of storage shelves 55 is a box made of a conductive material, having neither front wall nor back wall. There are compartment plates $79_1$, $79_2$, . . . of a conductive material unitedly incorporated in order in the box between the top plate and the bottom plate $79_N$ of the box. This arrangement allows N wafers to be stored in the storage shelves 55, where an example of N is (25×n+1) using an integer n≧1. That is, the number of wafers is 26, 51, 76, . . . If n=0, N is 1.

Further, the column of storage shelves 55 is fixed by screwing on the setting table 54, and three conductive ceramic pins 80A, 81A, 82A are planted on the compartment plate $79_1$ in the storage shelves 55. Similarly, three conductive ceramic pins are planted on each of the other compartment plates $79_2$, $79_3$, . . . , and the bottom plate $79_N$. For example, in the case of exposure for one lot of wafers, wafers $11_1$, $11_2$, . . . , $11_N$ are set on the compartment plates $79_1$, $79_2$, . . . , and the bottom plate $79_N$, respectively.

As described, because the column of storage shelves 55 is made of a conductive material, the adhesion of dust etc. to the storage shelves and wafers can be reduced. Since the compartment plates are provided in the storage shelves 55, accidents in which dust produced from the back surface or edge portion of a wafer on an upper shelf might drop to attach to another wafer, on a lower shelf, can be prevented.

For example, when a wafer $11_1$ is taken out of the storage shelves 55, the hand member 45 of the scalar robot hand 47 is put between the back face of wafer $11_1$ and the compartment plate $79_1$, as shown in FIG. 6, which is a cross section taken along 6—6 line in FIG. 5, and then the wafer $11_1$ is taken out.

In the present embodiment, because the number of wafers in one lot upon normal exposure is 25×n, the storage shelves 55 of the present embodiment can store one more wafer. The number of wafers may be increased for more extra wafers to be stored. The shelf for the extra wafer may be used to store, for example, a reference wafer of high flatness for measurement of flatness on the wafer holder 9T (FIG. 1), a mask wafer for self-measurement (inspection) of apparatus, or a wafer for cleaning the contact portions with wafer, etc. Although the present embodiment is so arranged that the space for storing the extra wafer is secured in a part of the storage shelves 55, another arrangement may employ an independent table, such as the temporary placing tables 56A, 56B in FIG. 1.

Since the inspection wafer or cleaning wafer is stored in the apparatus, the operator does not need to take the inspection wafer or cleaning wafer in and out, which improves the operating efficiency, of exposure apparatus and which can prevent intrusion of dust into the chamber and the temperature change in the chamber.

Since the column of storage shelves 55 of the present embodiment is open both on the front and back sides, inspection light can pass from the front or back. Then, as shown in FIG. 1, a light projector 57 and a light receiver 58 are set on either side of the storage shelves 55 on the inner side surface of chamber. A light beam emitted from the light projector 57 passes through the storage shelves 55 if there is not a wafer in the storage shelf 55, thus being received by the light receiver 58; the light beam is interrupted if there is a wafer. This can check presence or absence of a wafer in the storage shelves 55. Further, this function can also be achieved even if the column of storage shelves 55 has a back wall insofar as it is a transparent body.

Although the column of storage shelves 55 is fixed by screwing on the setting table 54 as shown in FIG. 5, the storage shelves 55 may be fixed by a lock mechanism which is freely opened and closed. With such a lock mechanism provided, even conventional storage, shelves 22 for process wafers (FIG. 1) can also be fixed on the setting table 55.

Figure 8:
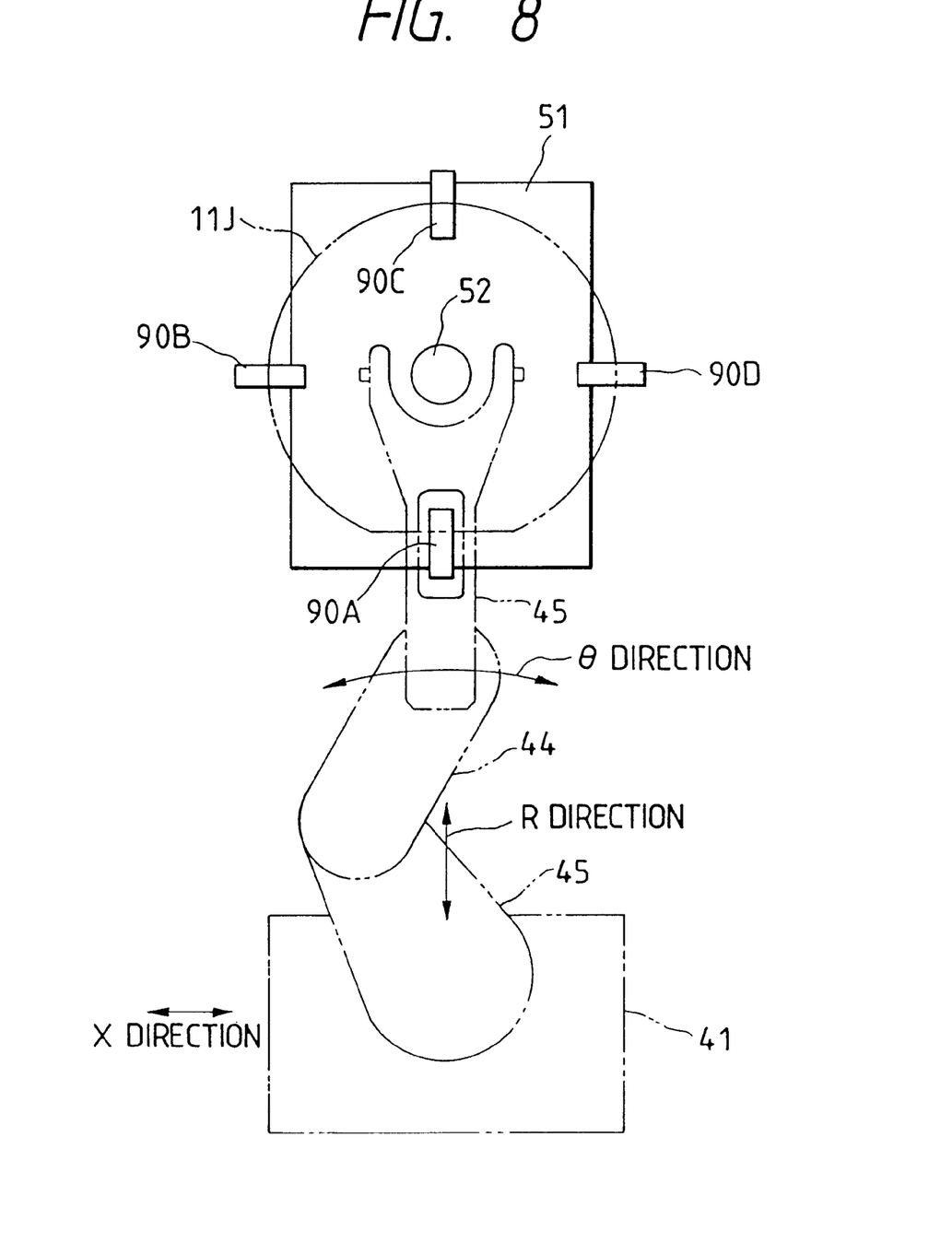
FIG. 8 is an enlarged plan view to showing another example of sensors near an adjustment table 51 in the first embodiment.

The above embodiment was so arranged, as shown, in FIG. 3, that the sensors in the sensor table 50, and the cut sensor including the light-projecting device 53 detected the center position of wafer 11J and the position of the cut portion (orientation flat or notch), respectively. The detection, however, may be effected by such an arrangement, as shown in FIG. 8, that light-projecting devices 90A–90D each for emitting a slit light beam downward are fixed at four locations above the adjustment table 51 and that line sensors are set as opposed to these light-projecting devices 90A–90D with the peripheral edge of wafer 11J disposed therebetween. In this case, the center position of wafer 11J can be roughly positioned at the center position of turn table 52 by driving and positioning the hand member 45 of the scalar robot hand by the servo method in the R direction, in the θ direction, or in the X direction so as to locate edge portions of wafer 11J at predetermined positions on the respective line sensors.

For example, using the light-projecting device 90A and the line sensor opposed thereto among the four combinations of light-projecting devices and line sensors, the cut portion (orientation flat or notch) of wafer 11J can also be detected. In this case, because there are four line sensors, the position of the cut portion can be detected rotating the wafer 11J at most about 90° from any direction to which the cut portion of wafer 11J is directed. The same positioning can be performed if there are two or more combinations of light-projecting devices and line sensors.

Figure 9:
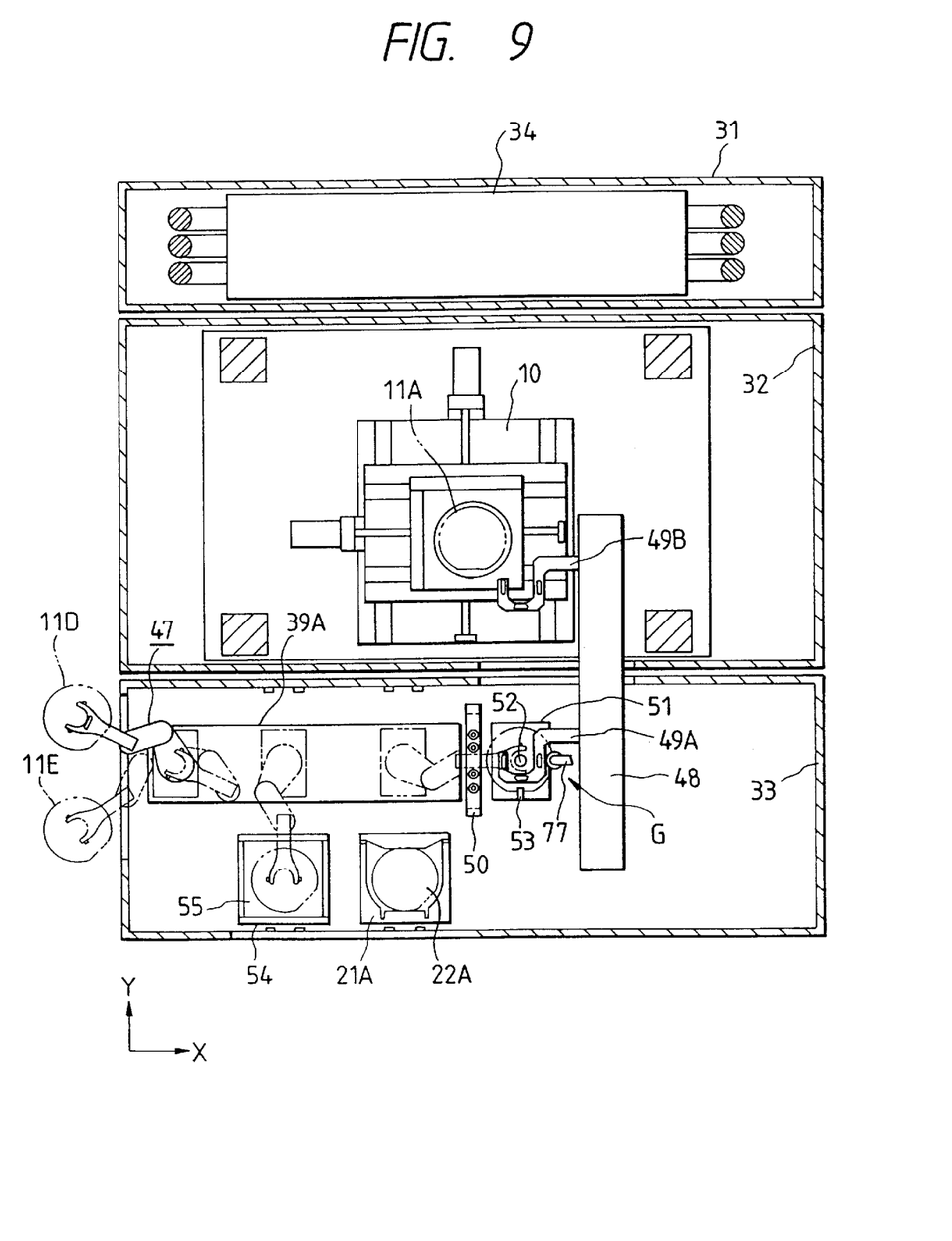
FIG. 9 is a cross-sectional plan view to showing a layout in a chamber, of a second embodiment of the exposure apparatus according to the present invention.
Figure 10:
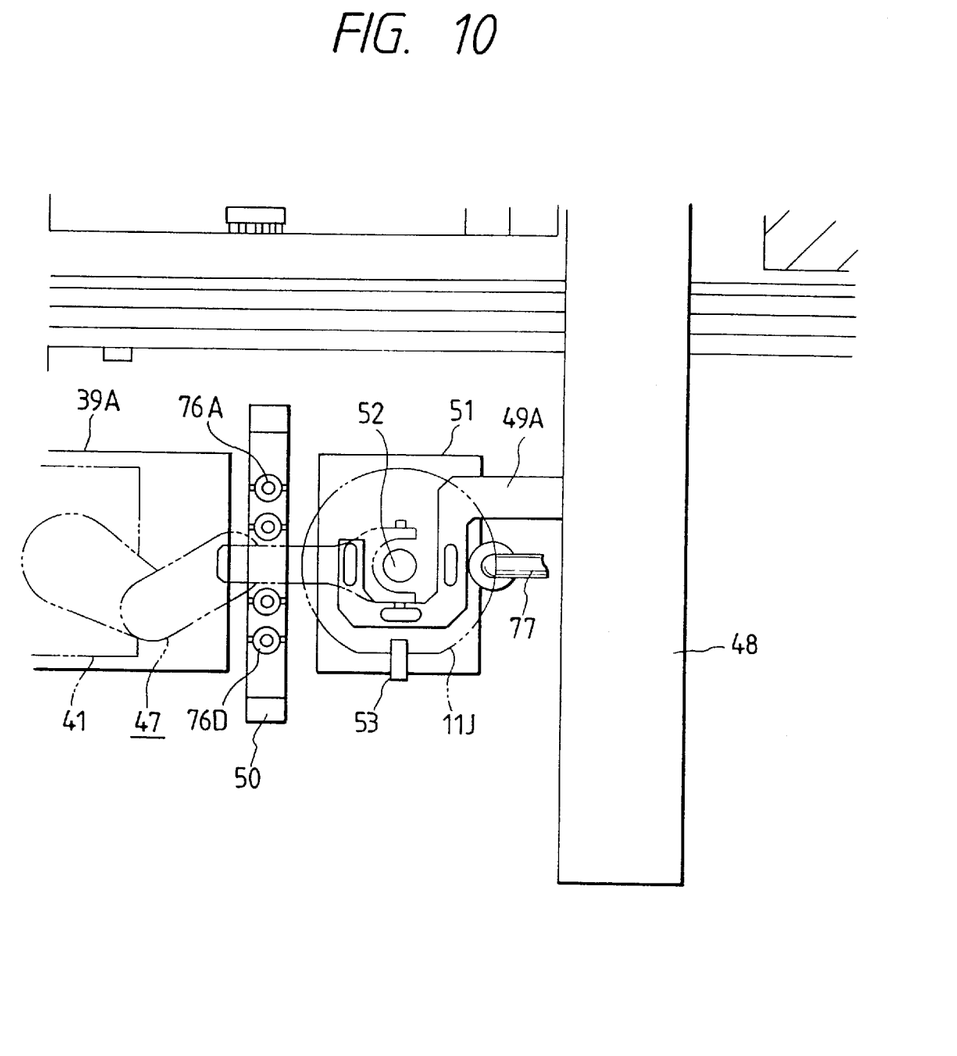
FIG. 10 is an enlarged plan view of section G in FIG. 9.

The second embodiment of the present invention is next described referring to FIG. 9 and FIG. 10. This embodiment is a modification of the embodiment of FIG. 1 wherein the length of the horizontal slider body 39 in the wafer loader system 38 is made shorter and, therefore, portions corresponding to those in FIG. 1 and FIG. 3 are denoted by the same reference numerals, with detailed description thereof accordingly omitted.

FIG. 9 is a plan view of the inside of the chamber in the second embodiment. In FIG. 9, the wafer loader system is set in the lower chamber of the third independent chamber 33. The X-directional guide of the wafer loader system is a horizontal slider body 39A, shorter than that in the first embodiment. A scalar robot hand 47 for holding a wafer is mounted on the horizontal slider body 39A so as to be slidable in the X direction along the horizontal slider body 39A. A wafer 11D or 11E can be handed over through an opening on the left side surface of chamber by the scalar robot hand 47, and a wafer can also be handed over from or to the storage shelves 55 or 22A.

The sensor table 50 is placed in the vicinity of the right end of the horizontal slider body 39A and four sets of light-projecting devices and light-receiving devices are arranged in the sensor table 50, similarly as in FIG. 4. Further, the adjustment table 51 is set on the right side of the sensor table 50. A turn table 52 is attached onto the adjustment table 51 so as to be rotatable. A detection sensor for detecting the cut wafer portion (orientation flat or notch), consisting of a light-projecting device 53, is attached to the front side surface of the adjustment table 51. In the present embodiment the vertical slider body 48 is set further right of the adjustment table 51. Sliders 49A and 49B are attached to the vertical slider body 48 so as to be slidable along the vertical slider body 48. A peripheral exposure portion including the light guide 77 is installed between the adjustment table 51 and the vertical slider body 48. The structure of the other parts is the same as in the first embodiment.

In the present embodiment, the wafer received by the scalar robot hand 47 is set on the turn table 52 after being positioned at the right end of the horizontal slider body 39A.

FIG. 10 is an enlarged view of section G near the adjustment table 51 in FIG. 9. As shown in FIG. 10, when the scalar robot hand 47 hands over the wafer 11J onto the turn table 52 at the right end of the horizontal slider body 39A, the sensor table 50 detects the center position of wafer 11J and the cut sensor including the light-projecting device 53 detects the position of the cut portion of wafer 11J. The peripheral exposure of wafer 11J is performed with necessity by the peripheral exposure system including the light guide 77. After that, the wafer 11J is handed over to the slider 49A and then is transferred to the main exposure system. According to this second embodiment, the wafer loader system is made compact.

It should be noted that the present invention is by no means limited to the above-described embodiments but may include a variety of arrangements within the scope not departing from the essence of the present invention, of course.

What is claimed is:

1. An exposure apparatus located in a chamber structure, comprising:
   an opening provided on an external wall of said chamber structure;
   a first transferring system which transfers, to a main exposure system, a first substrate which is coated with photosensitive material and brought through said opening;
   a second transferring system which transfers a second substrate formed with a predetermined pattern which is translated by said main exposure system to the photosensitive material coated on the first substrate; and
   a compartment member which is provided between said first transferring system and said second transferring system, said compartment member spatially separating second transferring system from said first transferring system.

2. An apparatus according to claim 1, wherein said first transferring system transfers the first substrate to or from an external system, which includes one of a coater which coats the first substrate with photosensitive material and a developer, via said opening.

3. An apparatus according to claim 2, wherein said first substrate transferring system includes a detecting device having a turntable which turns the first substrate while holding the first substrate, and said detecting device detects information relating to a shape of the first substrate.

4. An exposure apparatus according to claim 2, wherein said first transferring system includes a robot hand having a slider which makes said robot hand slidable, a θ-axis rotating member rotatable around a predetermined axis, and a Z-axis moving member movable in a Z-direction perpendicular to a horizontal plane.

5. An exposure apparatus according to claim 2, wherein said first transferring system includes a slide assembly having a guide and a slider movable along the guide.

6. An exposure apparatus according to claim 2, wherein said second transferring system includes a slide assembly having a guide and a slider movable along the guide.

7. An apparatus according to claim 2, further comprising:
   a compartment member which spatially separates said main exposure system from said first transferring system.

8. An apparatus according to claim 7, wherein said first transferring system has a detecting device which includes a turntable which turns the first substrate while holding the first substrate, and said detecting device detects information relating to a shape of the first substrate.

9. An exposure apparatus according to claim 7, wherein said first transferring system includes a robot hand having a slider which makes said robot hand be slidable, a θ-axis rotating member rotatable around a predetermined axis, and a Z-axis moving member movable in a Z-direction perpendicular to a horizontal plane.

10. An exposure apparatus according to claim 7, wherein said first transferring system includes a slide assembly having a guide and a slider movable along the guide.

11. An apparatus according to claim 2, further comprising:
    a compartment member which spatially separates said main exposure system from both of said first transferring system and said second transferring system.

12. An exposure apparatus according to claim 11, wherein said second transferring system includes a slide assembly having a guide and a slider movable along the guide.

13. An apparatus according to claim 12, wherein said first transferring system includes a detecting device having a turntable which turns the first substrate while holding the first substrate, and said detecting device detects information relating to a shape of the first substrate.

14. An exposure apparatus according to claim 12, wherein said first transferring system includes a robot hand having a slider which makes said robot hand slidable, a θ-axis rotating member rotatable around a predetermined axis, and a Z-axis moving member movable in a Z-direction perpendicular to a horizontal plane.

15. An exposure apparatus according to claim 12, wherein said fist transferring system includes a slide assembly having a guide and a slider movable along the guide.

16. An apparatus according to claim 11, wherein said first transferring system has a detecting device which includes a turntable which turns the first substrate while holding the first substrate, and said detecting device detects information relating to a shape of the first substrate.

17. An exposure apparatus according to claim 11, wherein said first transferring system includes a robot hand having a slider which makes said robot hand slidable, a θ-axis rotating member rotatable around a predetermined axis, and a Z-axis moving member movable in a Z-direction perpendicular to a horizontal plane.

18. An exposure apparatus according to claim 11, wherein said fist transferring system includes a slide assembly having a guide and a slider movable along the guide.

19. An exposure apparatus according to claim 1, wherein said second transferring system includes a slide assembly having a guide and a slider movable along the guide.

20. An apparatus according to claim 1, further comprising:
a compartment member which spatially separates said main exposure system from said second transferring system.

21. An exposure apparatus according to claim 20, wherein said second transferring system includes a slide assembly having a guide and a slider movable along the guide.

22. An exposure apparatus according to claim 1, wherein said first transferring system brings the coated substrate through said opening.

23. A method for manufacturing an exposure apparatus located in a chamber structure, comprising:
providing an opening on an external wall of said chamber structure;
providing a first transferring system which transfers, to a main exposure system, a first substrate which is coated with photosensitive material and brought through said opening;
providing a second transferring system which transfers a second substrate formed with a predetermined pattern which is translated by said main exposure system to the photosensitive material coated on the first substrate; and
providing a compartment member between said first transferring system and said second transferring system, said compartment member spatially separating said second transferring system from said first transferring system.

24. A method according to claim 23, wherein said first transferring system transfers the first substrate to and from an external system, which includes one of a coater which coats the first substrate with photosensitive material and a developer, via said opening.

25. A method according to claim 23, wherein said first substrate transferring system includes a detecting device having a turntable which turns the first substrate while holding the first substrate, and said detecting device detects information relating to a shape of the first substrate.

26. A method according to claim 25, wherein said first transferring system includes a slide assembly having a guide and a slider movable along the guide.

27. A method according to claim 23, wherein said first transferring system includes a robot hand having a slider which makes said robot hand slidable, a θ-axis rotating member rotatable around a predetermined axis, and a Z-axis moving member movable in a Z-direction perpendicular to a horizontal plane.

28. A method according to claim 23, wherein said second transferring system includes a slide assembly having a guide and a slider movable along the guide.

29. A method according to claim 23, further comprising:
providing a compartment member which spatially separates said main exposure system from said first transferring system.

30. A method according to claim 29, wherein said first transferring system includes a detecting device having a turntable which turns the first substrate while holding the first substrate, and said detecting device detects information relating to a shape of the first substrate.

31. A method according to claim 23, including providing a compartment member which spatially separates said main exposure system from said second transferring system.

32. A method according to claim 31, wherein said second transferring system includes a slide assembly having a guide and a slider movable along the guide.

33. A method according to claim 23, further comprising:
providing a compartment member which spatially separates said main exposure system from both of said first transferring system and said second transferring system.

34. A method according to claim 33, wherein said second transferring system includes a slide assembly having a guide and a slider movable along the guide.

35. A method according to claim 23, wherein said first transferring system brings the coated substrate through said opening.

* * * * *